United States Patent
Shie (10) Patent No.: US 7,965,366 B2
(45) Date of Patent: Jun. 21, 2011

(54) FLEXIBLE PRINTED CIRCUIT BOARD WITH ALIGNMENT MARKS IN PARTICULAR POSITIONS

(75) Inventor: De-Ching Shie, Miao-Li (TW)

(73) Assignee: Chimel Innolux Corporation, Miao-Li County (TW)

( * ) Notice: Subject to any disclaimer, the term of this patent is extended or adjusted under 35 U.S.C. 154(b) by 533 days.

(21) Appl. No.: 12/082,782

(22) Filed: Apr. 14, 2008

(65) Prior Publication Data

US 2008/0253074 A1 Oct. 16, 2008

(30) Foreign Application Priority Data

Apr. 13, 2007 (CN) .......................... 2007 1 0074016

(51) Int. Cl.
*G02F 1/1345* (2006.01)
*H05K 1/00* (2006.01)
(52) U.S. Cl. ......... 349/150; 349/149; 361/749; 361/751
(58) Field of Classification Search .................. 349/149, 349/150; 361/749, 750, 751
See application file for complete search history.

(56) References Cited

U.S. PATENT DOCUMENTS

| 5,670,994 | A | * | 9/1997 | Kawaguchi et al. | 345/206 |
| 5,914,763 | A | * | 6/1999 | Fujii et al. | 349/149 |
| 6,472,820 | B1 | | 10/2002 | Mo | |
| 6,525,719 | B2 | * | 2/2003 | Yamazaki et al. | 345/211 |
| 6,657,606 | B2 | | 12/2003 | Kang et al. | |
| 2002/0027634 | A1 | * | 3/2002 | Kang et al. | 349/150 |

FOREIGN PATENT DOCUMENTS

| CN | 1184508 C | 1/2005 |
| JP | 2003-17818 A | 1/2003 |
| TW | 548482 B | 8/2003 |
| TW | I232567 B | 5/2005 |

* cited by examiner

*Primary Examiner* — Michael H Caley
(74) *Attorney, Agent, or Firm* — Wei Te Chung (57) ABSTRACT

An exemplary flexible printed circuit board (2) includes a substrate (221), a plurality of connecting fingers (225, 227) and at least one alignment mark (229). The connecting fingers and the at least one alignment mark are located on a surface of the substrate. The at least one alignment mark is disposed between two of the connecting fingers.

17 Claims, 8 Drawing Sheets

FLEXIBLE PRINTED CIRCUIT BOARD WITH ALIGNMENT MARKS IN PARTICULAR POSITIONS

FIELD OF THE INVENTION

The present invention relates to a flexible printed circuit (FPC) board, and particularly to an FPC having one or more alignment marks positioned to optimize a layout of connecting fingers nearby. The present invention also relates to a display device including such FPC and typically having a configuration complementary to that of the FPC.

GENERAL BACKGROUND

Many display devices such as liquid crystal display devices (LCDs) need a flexible printed circuit board (FPC) to connect a variety of electronic circuits together.

Figure 6:
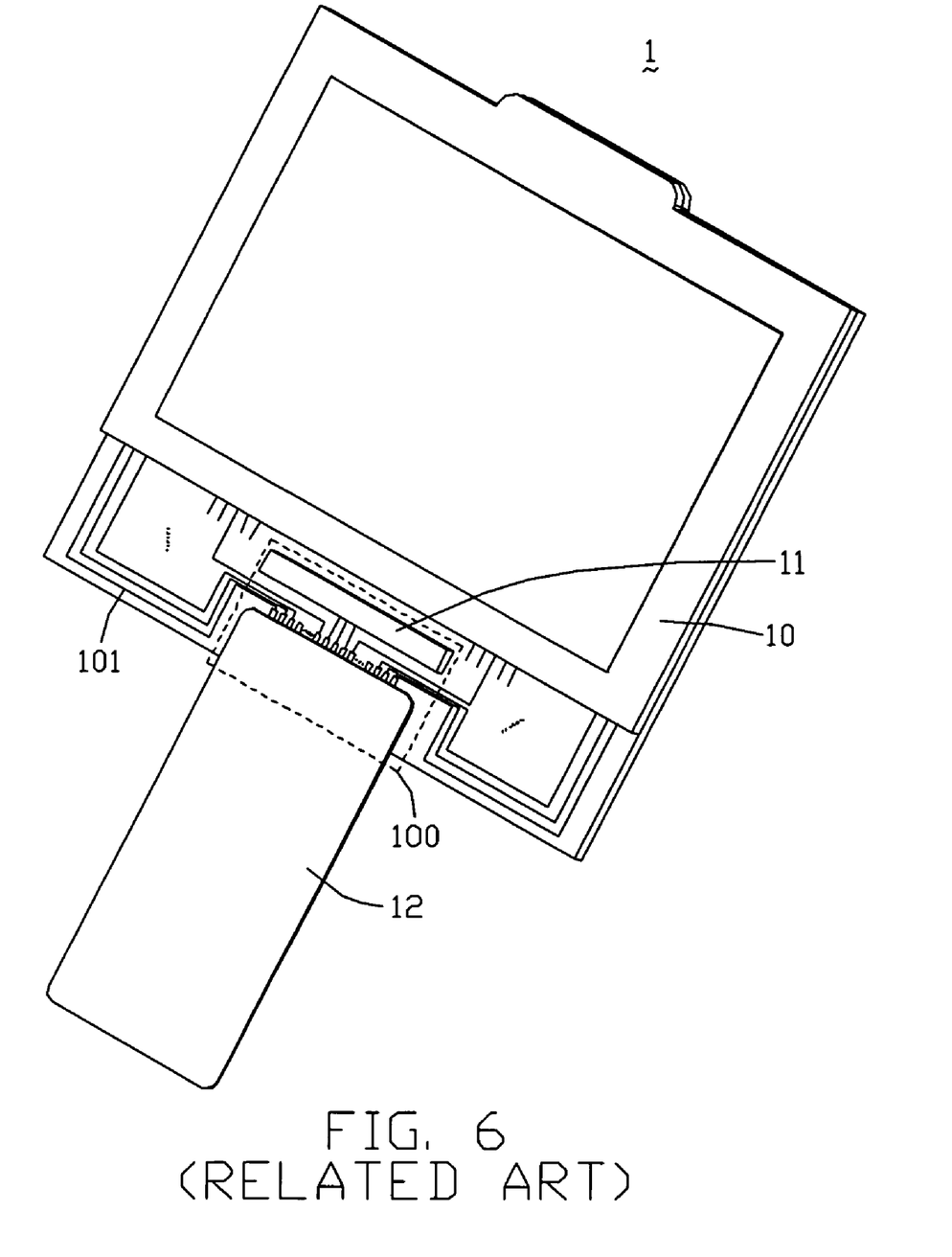
FIG. 6 is an isometric view of a conventional display device, the display device including a display panel and an FPC, showing certain parts of the display device in abbreviated form.

Referring to FIG. 6, a typical display device 1 includes a display panel 10, a driving circuit 11 and an FPC 12. The display panel 10 includes a front substrate (not labeled) and a rear substrate (not labeled) substantially abutting the front substrate. A plurality of conductive lines 101 are located on a surface of the rear substrate that faces toward the front substrate. Ends of the conductive lines 101 extend to a predetermined area of the edge of the rear substrate thereby defining a bonding area 100. The driving circuit 11 and one end of the FPC 12 are mounted to the bonding area 100.

Figure 7:
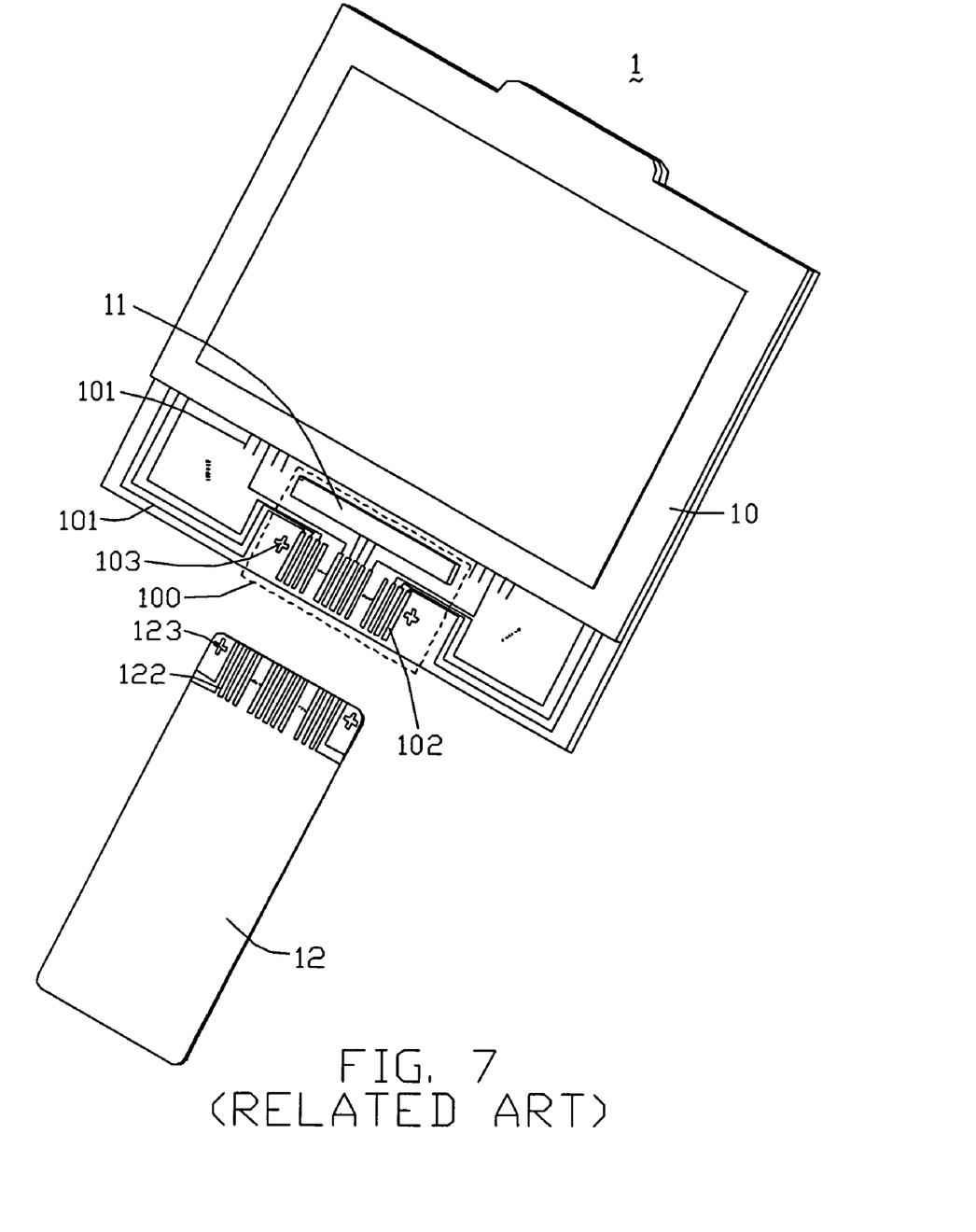
FIG. 7 is similar to FIG. 6, but showing the FPC detached from the display panel and inverted.

Referring also to FIG. 7, driving signals generated from a driving circuit board (not shown) are applied via the FPC 12 to circuit pads 102 that are embedded in the bonding area 100. The circuit pads 102 are elongate, parallel to each other, and perpendicular to the edge of the rear substrate. The circuit pads 102 are spaced apart from each other at regular intervals. One end of each circuit pad 102 is connected to a corresponding conductive line 101 or to a terminal pin of the driving circuit 11. Two cross-shaped first alignment marks 103 are symmetrically disposed on two opposite lateral sides of the plurality of circuit pads 102, respectively. The FPC 12 includes a plurality of conductive fingers 122 and two second alignment marks 123. The conductive fingers 122 are parallel to each other and perpendicular to the end of the FPC 12, and are spaced apart from each at regular intervals. The second alignment marks 123 have the same shape as the first alignment marks 103. The second alignment marks 123 are symmetrically disposed on two opposite lateral sides of the plurality of conductive fingers 122, respectively. A distance between the two second alignment marks 123 is equal to a distance between the two first alignment marks 103.

Figure 8:
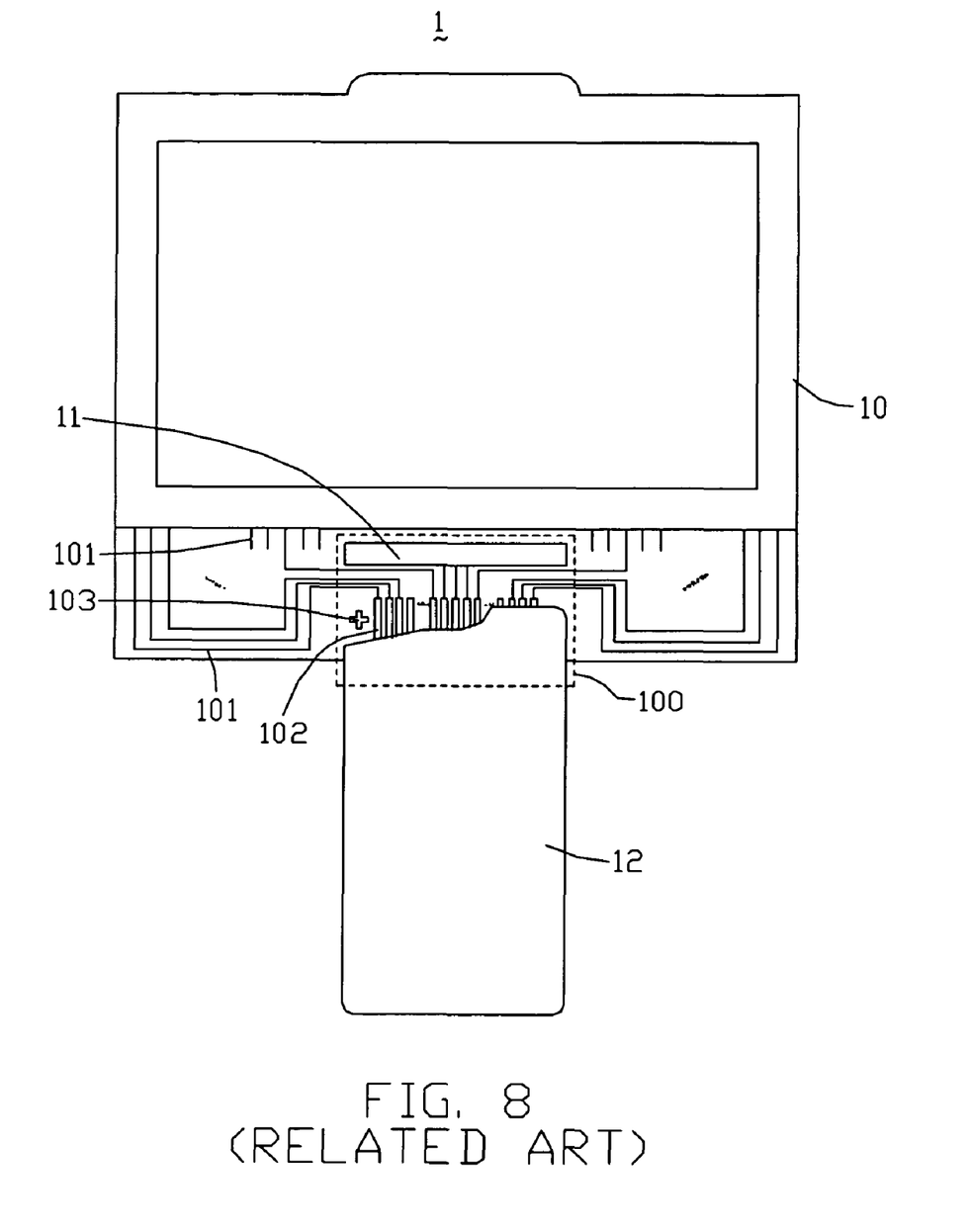
FIG. 8 is a front plan view of the display device of FIG. 6, showing part of the FPC cut away.

Referring also to FIG. 8, in assembly, the second alignment marks 123 are precisely aligned with the first alignment marks 103 respectively, so that the conductive fingers 122 are precisely coupled with the circuit pads 102. Then the conductive fingers 122 are pressed against the circuit pads 102 at a temperature of 100 degrees Centigrade for 2 to 5 seconds. By this process, the FPC 12 is electrically connected to the circuit pads 102, and the driving signals can be transmitted to the display panel 10 via the FPC 12.

However, the conductive lines 101 adjacent to the edge of the display panel 10 have to be bent around the first alignment marks 103 so as to correspondingly connect with the circuit pads 102. Thus a distance between bend portions of each two adjacent conductive lines 101 is reduced. Short circuits are particularly liable to occur between the bend portions. Therefore the reliability of the connection between the display panel 10 and the FPC 12 may be rather poor. In addition, the bend portions need extra area at the bottom of the display panel 10. Accordingly, an area of the display panel 10 available for displaying is reduced.

What is needed, therefore, is an FPC that can overcome the above-described deficiencies. What is also needed is a display device employing such FPC.

SUMMARY

In an exemplary embodiment, a flexible printed circuit board includes a substrate, a plurality of conductive fingers and at least one alignment mark. The conductive fingers and the at least one alignment mark is provided on a surface of the substrate. The at least one alignment mark is provided between two of the conductive fingers.

Other novel features and advantages will become more apparent from the following detailed description when taken in conjunction with the accompanying drawings. In the drawings, all the views are schematic.

DETAILED DESCRIPTION OF PREFERRED EMBODIMENTS

Figure 1:
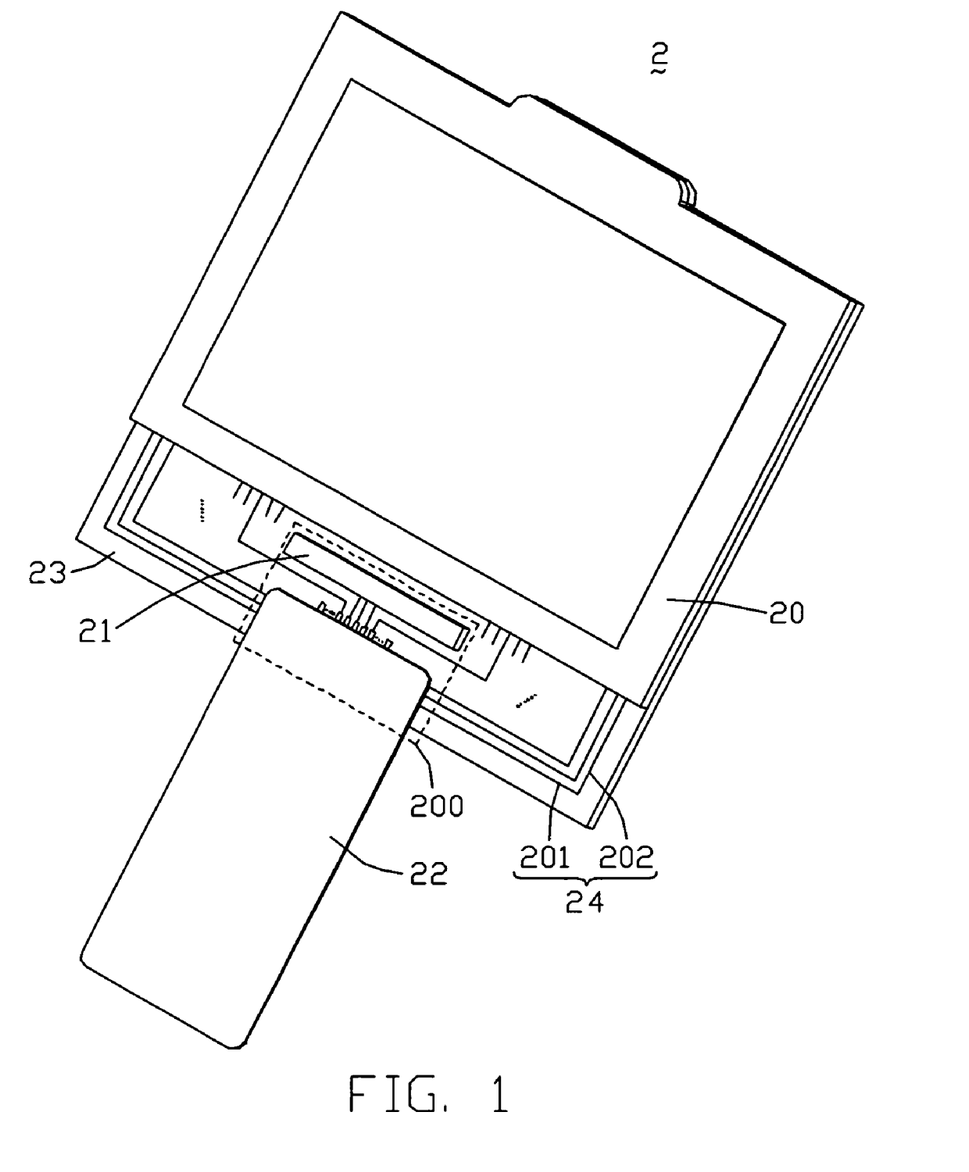
FIG. 1 is an isometric view of a display device according to a first embodiment of the present invention, the display device including a display panel and an FPC, showing certain parts of the display device in abbreviated form.

Referring to FIG. 1, a display device 2 according to a first embodiment of the present invention is shown. The display device 2 includes a display panel 20, a driving integrated circuit (IC) 21, and an FPC 22. The display panel 20 includes a front substrate (not labeled) and a rear substrate (not labeled) parallel to the front substrate. The rear substrate includes an extending portion 23 that extends beyond the front substrate. A plurality of conductive lines 24 are formed on a surface of the rear substrate that faces toward the front substrate. Ends of the conductive lines 24 extend to a predetermined area of the extending portion 23 thereby defining a bonding area 200. A major portion of the display panel 20 where the front substrate overlaps the rear substrate defines a display area (not labeled). The driving IC 21 and one end of the FPC 22 are bonded on the bonding area 200, and are thereby electrically connected to the conductive lines 24.

Figure 2:
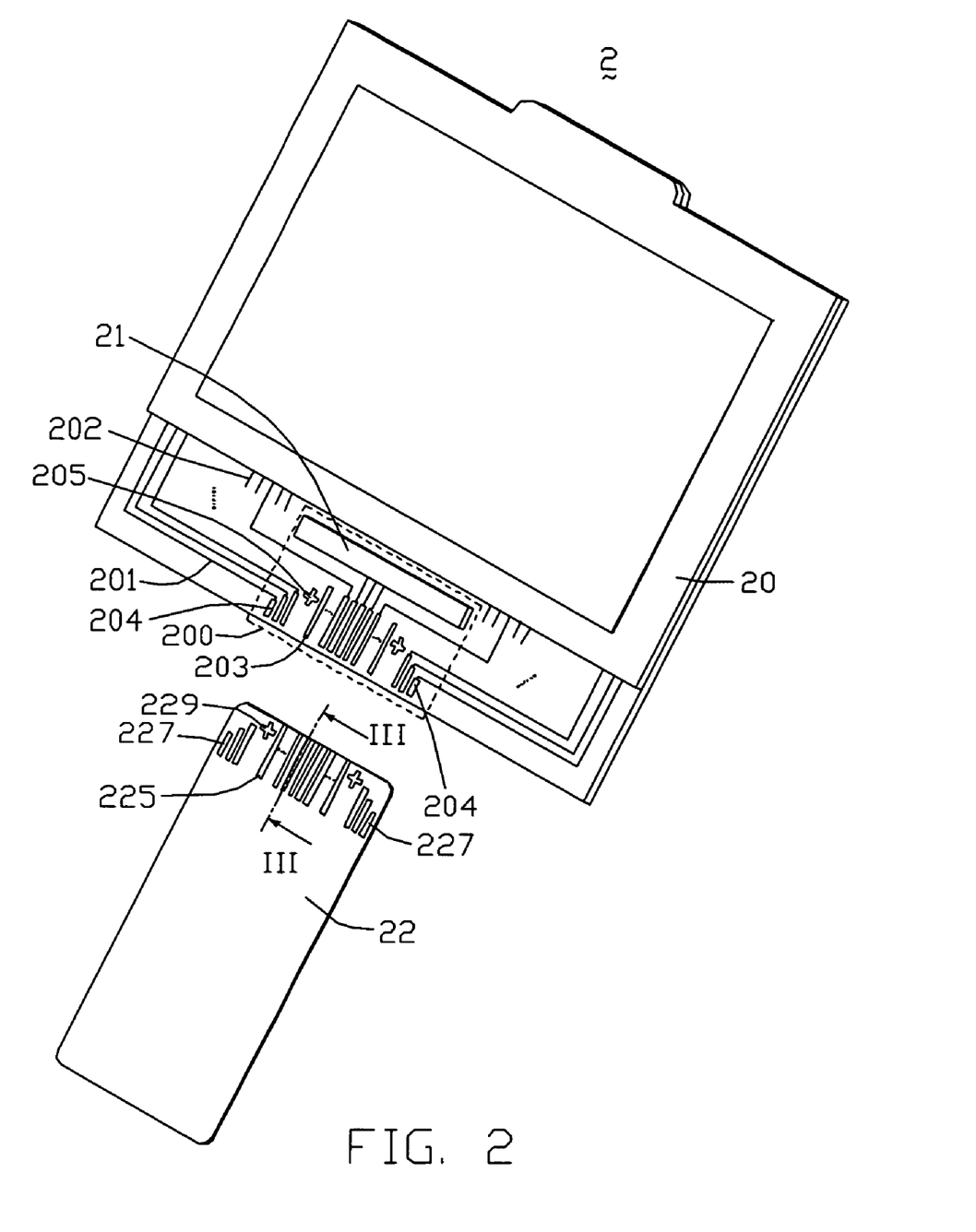
FIG. 2 is similar to FIG. 1, but showing the FPC detached from the display panel and inverted.

Referring also to FIG. 2, the bonding area 200 includes a first circuit pad assembly 203, two second circuit pad assemblies 204, and two first alignment marks 205. The first circuit pad assembly 203 includes a plurality of first circuit pads (not labeled) that are parallel to each other and perpendicular to a bottom edge of the extending portion 23. The first circuit pads have the same length, and are spaced apart from each other at regular intervals. The two second circuit pad assemblies 204 are symmetrically disposed at opposite lateral sides of the first circuit pad assembly 203, respectively. Each second circuit pad assembly 204 includes a plurality of second circuit pads (not labeled) that are parallel to each other and perpendicular to the bottom edge of the extending portion 23. Lengths of the second circuit pads decrease with increasing distance away from the first circuit pad assembly 203. The second circuit pads are spaced apart from each other at regular intervals. The two first alignment marks 205 are symmetrically disposed at opposite lateral sides of the first circuit pad assembly 203, respectively, with each first alignment mark 205 being between the first circuit pad assembly 203 and the corresponding second circuit pad assembly 204.

Each conductive line 24 includes a first conductive portion 201 and a second conductive portion 202. The first conductive portions 201 are parallel to each other, and each first conductive portion 201 is essentially aligned along a direction perpendicular to the first circuit pads of the first circuit pad assembly 203. The second conductive portions 202 directly extend perpendicularly down from the display area. One end of each first conductive portion 201 is connected to a corresponding first circuit pad or a corresponding second circuit pad. The other end of each first conductive portion 201 is connected to a corresponding second conductive portion 202. Thus in the illustrated embodiment, the first conductive portions 201 and the second conductive portions 202 are essentially perpendicular to each other.

Figure 3:
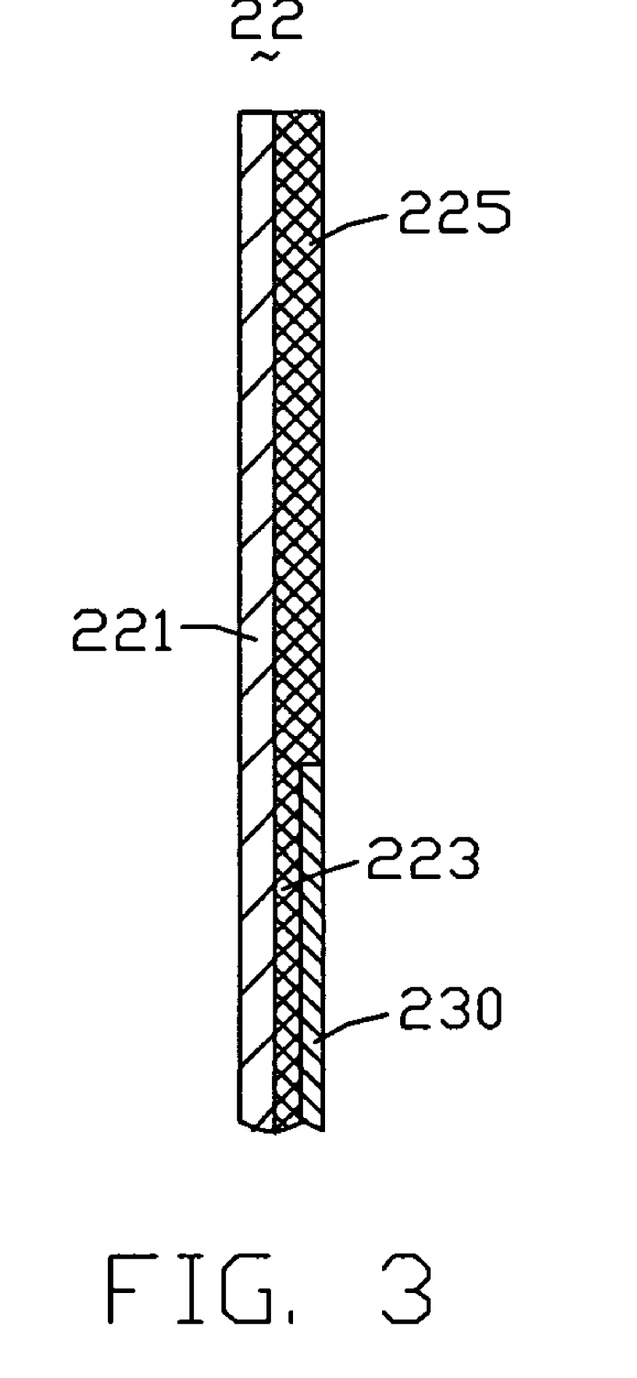
FIG. 3 is an enlarged, cross-sectional view taken along line III-III of FIG. 2.

Referring also to FIG. 3, the FPC 22 includes a substrate 221, a conductive pattern layer 223, a first connecting finger assembly 225, two second connecting finger assemblies 227, two second alignment marks 229, and a resin layer 230. The first connecting finger assembly 225 includes a plurality of first metal fingers (not labeled) that are parallel to each other and perpendicular to the end of the FPC 22. The first metal fingers have the same length, and are spaced apart from each other at regular intervals. The two second connecting finger assemblies 227 are symmetrically disposed at opposite lateral sides of the first connecting finger assembly 225, respectively. Each second connecting finger assembly 227 includes a plurality of second metal fingers (not labeled) that are parallel to each other and perpendicular to the end of the FPC 22. Lengths of the second metal fingers decrease with increasing distance away from the first connecting finger assembly 225. The second metal fingers are spaced apart from each other at regular intervals. The two second alignment marks 229 are symmetrically printed at opposite lateral sides of the first connecting finger assembly 225, respectively, with each second alignment mark 229 being between the first connecting finger assembly 225 and the corresponding second connecting finger assembly 227. Shapes of the second alignment marks 229 are the same as shapes of the first alignment marks 205. A distance between the two second alignment marks 229 is equal to a distance between the two first alignment marks 205. The conductive pattern layer 223 includes a plurality of conductive wires (not shown) that are connected to the first metal fingers and the second metal fingers. The resin layer 230 covers the conductive pattern layer 223 to protect the conductive wires from being exposed to air. The substrate 221 can be made from polyimide (PI) resin. The conductive pattern layer 223 can be fabricated by electrolyzing or rolling clutch gold.

Figure 4:
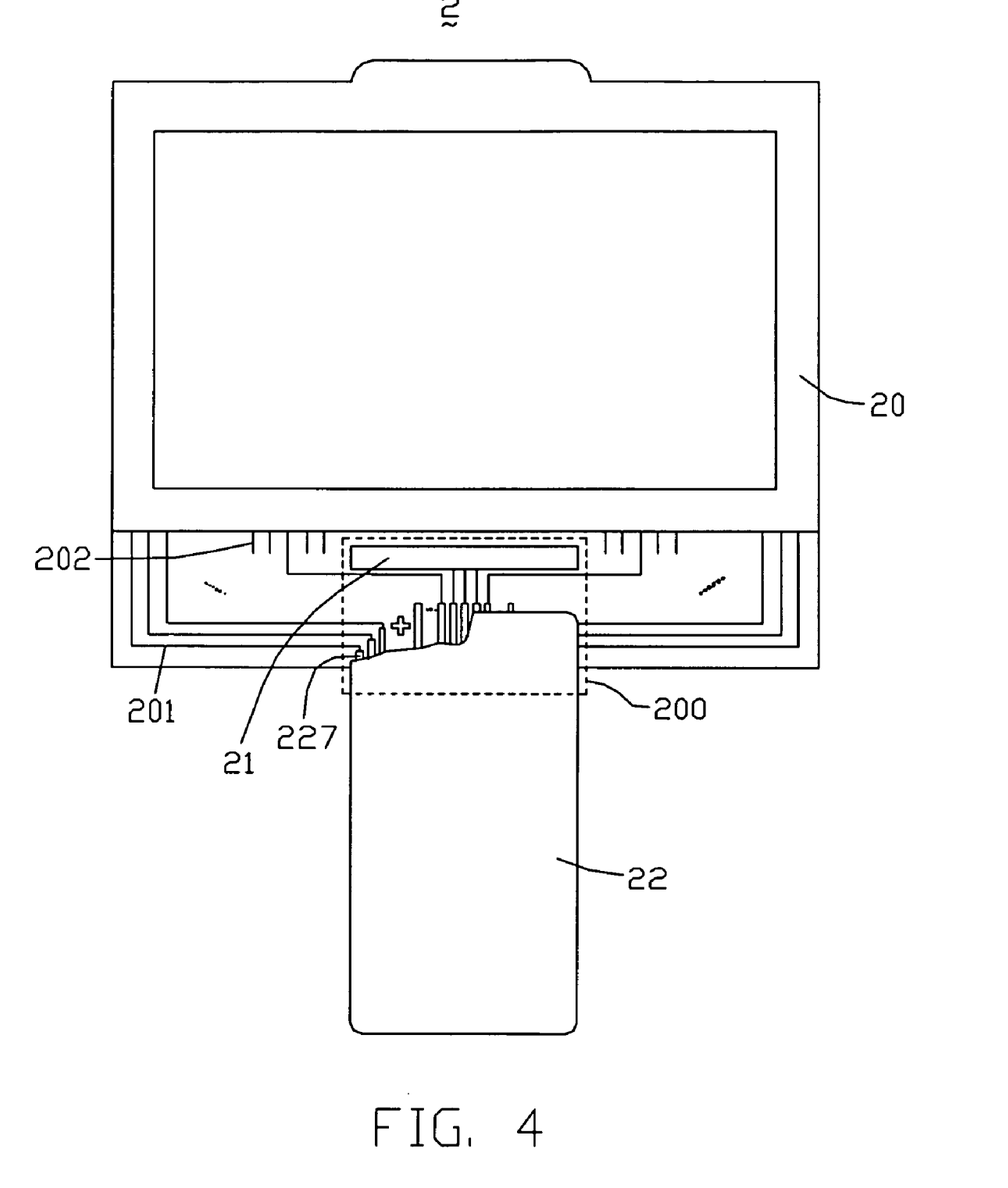
FIG. 4 is a front plan view of the display device of FIG. 1, showing part of the FPC cut away.

Referring also to FIG. 4, in a typical assembly process, the second alignment marks 229 are precisely aligned with the first alignment marks 205 respectively. Thereby, the first connecting finger assembly 225 and the second connecting finger assemblies 227 of the FPC 22 are respectively aligned with the first circuit pad assembly 203 and the second circuit pad assemblies 204 of the display panel 20. Then the first connecting fingers 225 and the second connecting fingers 227 are respectively pressed against the first circuit pads 203 and the second circuit pads 204 at a temperature of 100 degrees Centigrade for about 2 to 5 seconds. By this process, the FPC 22 is electrically connected to the display panel 20, and driving signals can be transmitted to the display panel 20 via the FPC 22.

Because the first alignment marks 205 are located between the first circuit pad assembly 203 and the second circuit pad assemblies 204, the first conductive portions 201 of the conductive lines 24 adjacent to the bottom edge of the extending portion 23 can directly connect to the corresponding second circuit pads without having to be formed (routed) around the first alignment marks 205. A distance between each two adjacent conductive lines 24 can be keep at a safe minimum distance, both at the first conductive portions 201 and the second conductive portions 202. Therefore the reliability of the connection between the display panel 20 and the FPC 22 is high. In addition, because the first conductive portions 201 are directly connected to the corresponding second circuit pads without the need to specially route the first conductive portions 201 (see above), there is no need for a larger area in order to keep the first conductive portions 201 a safe minimum distance apart from each other. Furthermore, because the lengths of the second metal fingers decrease with increasing distance away from the first connecting finger assembly 225, the first conductive portions 201 and the second circuit pads can be conveniently connected.

Figure 5:
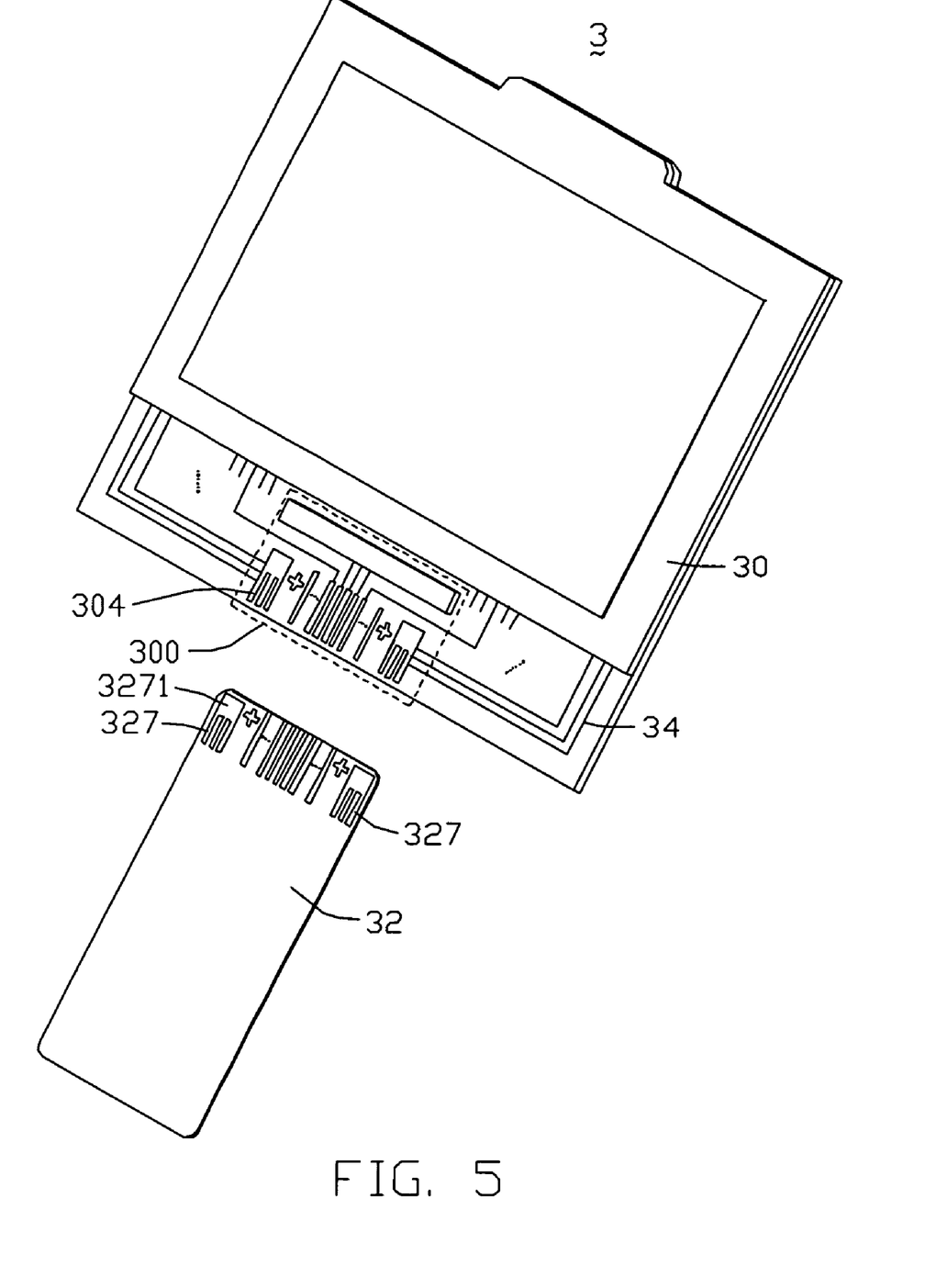
FIG. 5 is similar to FIG. 2, but showing a corresponding view in the case of a display device according to a second embodiment of the present invention.

Referring to FIG. 5, a display device 3 according to a second embodiment of the present invention is similar to the display device 2. However, top ends of a predetermined number of second metal fingers 327 of an FPC 32 are connected with each other, thereby forming a connecting block 3271. These second metal fingers 327 are used to provide a common voltage to a display panel 30. The FPC 32 is bonded on a bonding area 300 of the display panel 30. The common voltage is transmitted to the display panel 30 via the connecting block 3271, corresponding second circuit pads 304, and corresponding conductive lines 34 in sequence. Because a contact area between the predetermined second metal fingers 327 and the corresponding second circuit pads 304 is increased, the reliability of the connection between the display panel 30 and the FPC 32 is further improved.

It is believed that the present embodiments and their advantages will be understood from the foregoing description, and it will be apparent that various changes may be made thereto without departing from the spirit or scope of the invention or sacrificing all of its material advantages, the examples hereinbefore described merely being preferred or exemplary embodiments of the invention.

What is claimed is:
1. A flexible printed circuit (FPC) board, comprising:
 a substrate,
 a plurality of connecting fingers comprising a plurality of first connecting fingers and a plurality of second connecting fingers provided at opposite lateral sides of the first connecting fingers, both the first connecting fingers and the second connecting fingers being perpendicular to an end of the substrate, and lengths of the second connecting fingers decreasing with increasing distance away from the plurality of first connecting fingers, and at least one alignment mark, the connecting fingers and the at least one alignment mark disposed on a surface of the substrate, wherein the at least one alignment mark is provided between the first connecting fingers and the second connecting fingers.

2. The flexible printed circuit board as claimed in claim 1, wherein the connecting fingers are spaced apart from each other at regular intervals.

3. The flexible printed circuit board as claimed in claim 1, wherein the first connecting fingers have the same length.

4. The flexible printed circuit board as claimed in claim 1, wherein top ends of a predetermined number of the second connecting fingers are connected with each other, thereby forming a connecting block.

5. The flexible printed circuit board as claimed in claim 1, further comprising a conductive pattern layer provided on a surface of the substrate, the conductive pattern layer comprising a plurality of conductive wires that are correspondingly connected to the plurality of first connecting fingers and the plurality of second connecting fingers.

6. The flexible printed circuit board as claimed in claim 5, further comprising a resin film covering the conductive pattern layer.

7. A display device comprising:
a display panel having a bonding area; and
a flexible printed circuit board bonded to the bonding area and electrically connected to the display panel, the flexible printed circuit board comprising:
a substrate,
a plurality of connecting fingers comprising a plurality of first connecting fingers and a plurality of second connecting fingers provided at opposite lateral sides of the first connecting fingers, both the first connecting fingers and the second connecting fingers being perpendicular to an end of the substrate, and lengths of the second connecting fingers decreasing with increasing distance away from the plurality of first connecting fingers, and
at least one alignment mark, wherein the connecting fingers and the at least one alignment mark are disposed on a surface of the substrate, and the at least one alignment mark is provided between the first connecting fingers and the second connecting fingers.

8. The display device as claimed in claim 7, wherein the display panel comprises a plurality of circuit pads and at least one second alignment mark in the bonding area, the circuit pads corresponding to the connecting fingers, the at least one second alignment mark corresponding to the at least one first alignment mark.

9. The display device as claimed in claim 8, wherein the display panel further comprises a plurality of conductive lines that are connected to the circuit pads.

10. The display device as claimed in claim 8, wherein the connecting fingers are spaced apart from each other at regular intervals.

11. The display device as claimed in claim 7, wherein the first connecting fingers have the same length.

12. The display device as claimed in claim 7, wherein top ends of a predetermined number of the second connecting fingers are connected with each other, thereby forming a connecting block.

13. The display device as claimed in claim 7, wherein the flexible printed circuit board further comprises a conductive pattern layer provided on a surface of the substrate, and the conductive pattern layer comprises a plurality of conductive wires that are correspondingly connected to the plurality of first connecting fingers and the plurality of second connecting fingers.

14. The display device as claimed in claim 13, wherein the flexible printed circuit board further comprises a resin layer covering the conductive pattern layer.

15. The display device as claimed in claim 7, wherein a plurality of first circuit pads and a plurality of second circuit pads are disposed in the bonding area, the first circuit pads and the second circuit pads respectively have configurations substantially the same as the first connecting fingers and the second connecting fingers of the flexible printed circuit board.

16. The display device as claimed in claim 15, wherein the display panel comprises a plurality of conductive lines electrically connected to the second connecting fingers of the flexible printed circuit board through the second circuit pads, the conductive lines are configured to provide a common voltage signal transmitted through the second connecting fingers to a display area of the display panel.

17. The display device as claimed in claim 16, wherein the conductive lines are disposed along edges of the display panel, and each conductive line is consisted of a first conductive portion perpendicular to the first circuit pad in the bonding area, and a second conductive portion perpendicular to first conductive portion.

* * * * *